United States Patent
Sun (10) Patent No.: US 11,846,677 B2
(45) Date of Patent: Dec. 19, 2023

(54) METHOD AND APPARATUS FOR MONITORING BATTERY BACKUP UNIT, SERVER, AND READABLE STORAGE MEDIUM

(71) Applicant: Inspur Suzhou Intelligent Technology Co., Ltd., Suzhou (CN)

(72) Inventor: Minggang Sun, Suzhou (CN)

(73) Assignee: INSPUR SUZHOU INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/802,807

(22) PCT Filed: Jul. 23, 2020

(86) PCT No.: PCT/CN2020/103649
§ 371 (c)(1),
(2) Date: Aug. 26, 2022

(87) PCT Pub. No.: WO2021/169162
PCT Pub. Date: Sep. 2, 2021

(65) Prior Publication Data
US 2023/0122667 A1    Apr. 20, 2023

(30) Foreign Application Priority Data
Feb. 28, 2020  (CN) .......... 202010131214.8

(51) Int. Cl.
G01R 31/382 (2019.01)
H02J 7/00 (2006.01)
G01R 31/392 (2019.01)

(52) U.S. Cl.
CPC ......... *G01R 31/382* (2019.01); *G01R 31/392* (2019.01); *H02J 7/0048* (2020.01); *H02J 7/00712* (2020.01)

(58) Field of Classification Search
CPC ... G01R 31/382; G01R 31/392; H02J 7/0048; H02J 7/00712
(Continued)

(56) References Cited

U.S. PATENT DOCUMENTS

| | | | |
|---|---|---|---|
| 10,371,753 B1 * | 8/2019 | Wang | H01M 10/48 |
| 2008/0186028 A1 * | 8/2008 | Jones | G01R 31/392 |
| | | | 324/426 |

(Continued)

FOREIGN PATENT DOCUMENTS

| | | |
|---|---|---|
| CN | 104297690 A | 1/2015 |
| CN | 104810891 A | 7/2015 |

(Continued)

OTHER PUBLICATIONS

International Search Report and Written Opinion including English Translation of corresponding PCT application No. PCT/CN2020/103649; dated Dec. 2, 2020 (16 pages).

(Continued)

*Primary Examiner* — Edward Tso
*Assistant Examiner* — Aaron Piggush
(74) *Attorney, Agent, or Firm* — Crowell & Moring LLP (57) ABSTRACT

A method and an apparatus for monitoring a Battery Backup Unit (BBU) (312), a server (301), and a readable storage medium (330) are provided. The method includes following steps: monitoring a voltage and a ampere-hour of the BBU (312) (S101); when the voltage is static and the variation of the ampere-hour is greater than a variation threshold value, determining a current moving window point by a remaining power percentage curve corresponding to the BBU (312) (S102); determining a current moving window by a previous moving window point and the current moving window point (S103); and calculating a remaining capacity of the BBU (312) by the current moving window (S104).

20 Claims, 4 Drawing Sheets

(58) Field of Classification Search
USPC ............... 320/132, 136, 156, 157, 161, 162
See application file for complete search history.

(56) References Cited

U.S. PATENT DOCUMENTS

| | | | | |
|---|---|---|---|---|
| 2009/0027056 | A1* | 1/2009 | Huang ................. | G01R 31/392 320/132 |
| 2013/0110428 | A1* | 5/2013 | Sun .................... | G01R 31/3842 702/63 |
| 2015/0377971 | A1* | 12/2015 | Keating ................. | H02J 9/061 307/130 |
| 2017/0074946 | A1* | 3/2017 | Ebrahimzadeh ..... | G01R 31/386 |
| 2022/0057453 | A1* | 2/2022 | Nicklaus ............. | H02J 7/00034 |

FOREIGN PATENT DOCUMENTS

| | | |
|---|---|---|
| CN | 105676128 A | 6/2016 |
| CN | 105842633 A | 8/2016 |
| CN | 107576918 A | 1/2018 |
| CN | 108287315 A | 7/2018 |
| CN | 109032320 A | 12/2018 |
| CN | 109188296 A | 1/2019 |
| CN | 109407013 A | 3/2019 |
| CN | 109633459 A | 4/2019 |
| CN | 109870659 A | 6/2019 |
| CN | 111273181 A | 6/2020 |
| JP | 2019178884 | 10/2019 |
| KR | 101164809 | 7/2012 |

OTHER PUBLICATIONS

First Office Action including English translation of corresponding CN priority application (CN202010131214.8) dated Mar. 22, 2021 (22 pages).

Search report of corresponding CN priority application (CN202010131214.8) dated Mar. 10, 2021 (1 page).

2nd Office Action including English translation of corresponding CN priority application (CN202010131214.8) dated Nov. 12, 2021 (23 pages).

Xu Zhang, "Lithium-ion Battery Pack States Estimation and Safety Management Based on System Complexity Analysis", Section 5.3.1, China Doctoral Dissertations Full-text Database, CDFD, No. 11, Nov. 15, 2018 including English translation (2 pages).

* cited by examiner

METHOD AND APPARATUS FOR MONITORING BATTERY BACKUP UNIT, SERVER, AND READABLE STORAGE MEDIUM

This application is the national phase application of International Application No. PCT/CN2020/103649, filed Jul. 23, 2020, which claims priority to Chinese Patent Application No. 202010131214.8, filed on Feb. 28, 2020, in China National Intellectual Property Administration and entitled "Method and Apparatus for Monitoring Battery Backup Unit, Server, and Readable Storage Medium", the contents of which are hereby incorporated by reference in its entirety.

FIELD

The present disclosure relates to the technical field of computers, and particularly to a method and an apparatus for monitoring a Battery Backup Unit (BBU), a server, and a readable storage medium.

BACKGROUND

A BBU is formed by combining lithium cells in series, in parallel, or in other manners, thereby meeting system requirements of a power supply voltage, a power supply capacity, etc. That is, the BBU is configured in a storage system to protect a data security after a power failure of the system. The BBU will continue to supply power after the power failure of the system. A process that ensuring a secure storage of various important data in the system is called backup.

With an increase of the number of charging cycles, the capacity of a lithium battery gradually decreases, and a capacity decay process of the lithium battery is intensified in case of a high temperature, a full-charge storage, etc. When the capacity of the BBU decreases to be lower than a system backup threshold value, the BBU is unable to support the system to complete a backup process, resulting in a user data loss. Therefore, it is quite important and necessary to accurately track a capacity decay process of the BBU and timely remind a user of replacing the BBU when the capacity is lower than 110% of the backup threshold value. With respect to a remaining power and a capacity of the BBU, the remaining power refers to the number of charges stored in the BBU, and is practically represented as an RCC value of a voltameter. A capacity value refers to the maximum number of charges that the BBU is able to hold, and is usually a chemical capacity or a design capacity, and is practically represented as a Full-Charge Capacity (FCC) value of the voltameter.

Currently, a common reminding method is as follows: the FCC value is read by a voltameter chip of the BBU, and then is compared with the backup threshold value. When the FCC value is close to the backup threshold value, the user is reminded of replacing the BBU. However, there are the following problems.

1: Certain conditions are required for the voltameter chip to update the FCC value. For a BBU replacement reminder, the conditions needs to satisfy that: the temperature is between 10° C. and 40° C.; a deep discharge occurs; and a battery voltage needs to be static, namely dv/dt<4 uV/s. These conditions are hard to satisfy in a practical production process. As a result, the FCC read by the metering chip is often not so accurate in a practical use.

2: During the production process of the BBU, the cell contains part of electricity when mounted. In such case, the FCC value of the metering chip is estimated based on the voltage of the cell. However, the voltage of the cell is not necessarily an open-circuit voltage after still standing, and thus the estimated FCC value is not so accurate. That is, first inaccurate estimation may also affect the calculation of the FCC during subsequent update.

3: The metering chip of the BBU updates the FCC value based on a charge cut-off voltage and a discharge cut-off voltage. For example, a full-charge voltage of a 12V BBU is defined to 12.6 V, while the discharge cut-off voltage is defined to 7.5 V, and they may be different from charge and discharge voltages in the practical use. In the practical use, the battery may be charged to 12.3V to prolong service life, leading to an inaccuracy of the FCC value of the metering chip.

4: The metering chip of the BBU estimates the FCC based on an open-circuit voltage and a State of Charge (SOC) curve of the battery. However, chemical characteristics of the battery are discrete, and curves of the batteries of different types differ greatly, while voltameter chips produced in batches are unable to customize a set of curves for each battery. As a result, the estimated FCC value is not so accurate.

In summary, whether a BBU is aged and needs to be replaced cannot be judged accurately at present. That is, how to effectively solve problems about the accuracy of detecting remaining power of a BBU, etc., is a technical problem urgent to be solved by those skilled in the art currently.

SUMMARY

An objective of the present disclosure is to provide a method and apparatus for monitoring a BBU, a server, and a readable storage medium, to improve the accuracy of detecting remaining power of a BBU and further remind a user of replacing a BBU incapable of meeting system requirements.

In order to solve the foregoing technical problem, the present disclosure provides the following technical solutions.

A method for monitoring a BBU is provided, including:
  monitoring a voltage and ampere-hour of a BBU;
  when the voltage is static and a variation of the ampere-hour is greater than a variation threshold value, determining a current moving window point by use of a remaining power percentage curve corresponding to the BBU;
  determining a current moving window by use of a previous moving window point and the current moving window point; and
  calculating a remaining capacity of the BBU by use of the current moving window.

In some embodiments of the present disclosure, the calculating a remaining capacity of the BBU by use of the current moving window includes:
  acquiring moving window power and a percentage difference of a moving window remaining power corresponding to the current moving window; and
  calculating a ratio of the moving window power to the percentage difference of the moving window remaining power, and determining the ratio as the remaining capacity.

In some embodiments of the present disclosure, the determining a current moving window point by use of a remaining power percentage curve corresponding to the BBU includes:

judging whether the remaining power percentage curve exists;

if YES, executing the step of determining a current moving window point by use of a remaining power percentage curve corresponding to the BBU; and if NO, fully charging and fully discharging the BBU, recording an ampere-hour according to a discharge granularity so as to obtain the remaining power percentage curve, and after the remaining power percentage curve is obtained, executing the step of determining a current moving window point by use of a remaining power percentage curve corresponding to the BBU.

In some embodiments of the present disclosure, the remaining power percentage curve is named after a serial number of the BBU. The judging whether the remaining power percentage curve exists includes:

judging whether there is a remaining power percentage curve corresponding to the serial number of the BBU;

if YES, determining that the remaining power percentage curve exists; and if NO, determining that the remaining power percentage curve does not exist.

In some embodiments of the present disclosure, the determining a current moving window point by use of a remaining power percentage curve corresponding to the BBU includes:

when the remaining power percentage curve exists, checking the remaining power percentage curve, and after successful checking, executing the step of determining a current moving window point by use of a remaining power percentage curve corresponding to the BBU.

In some embodiments of the present disclosure, the method further includes:

reducing the variation threshold value according to service time of the BBU.

In some embodiments of the present disclosure, after the remaining capacity of the BBU is calculated by use of the current moving window, alarm prompting information is output when the remaining capacity is less than an alarm threshold value.

An apparatus for monitoring a BBU is provided, including:

an ampere-hour statistical monitoring module, configured to monitor a voltage and ampere-hour of a BBU;

an ampere-hour moving window point determination module, configured to, when the voltage is static and the variation of the ampere-hour is greater than a variation threshold value, determine a current moving window point by use of a remaining capacity percentage curve corresponding to the BBU;

a moving window determination module, configured to determine a current moving window by use of a previous moving window point and the current moving window point; and a remaining capacity calculation module, configured to calculate a remaining capacity of the BBU by use of the current moving window.

A server is provided, including:

a BBU, configured to continue supplying power after a power failure;

a memory, configured to store a computer program; and a processor, configured to execute the computer program to implement the steps of the method for monitoring a BBU.

A readable storage medium is provided, storing a computer program that is executed by a processor to implement the steps of the method for monitoring a BBU.

With the application of the method provided in embodiments of the present disclosure, a voltage and ampere-hour of a BBU are monitored; when the voltage is static and the variation of the ampere-hour is greater than a variation threshold value, a current moving window point is determined by use of a remaining power percentage curve corresponding to the BBU; a current moving window is determined by use of a previous moving window point and the current moving window point; and a remaining capacity of the BBU is calculated by use of the current moving window.

In the present method, the voltage and ampere-hour of the BBU are monitored, and only when the voltage is static and the variation of the ampere-hour is greater than the variation threshold value, the current moving window point is determined by use of the remaining power percentage curve corresponding to the BBU. Then, the current moving window is determined based on the previous moving window point and the current moving window point. Finally, the remaining capacity of the BBU is calculated based on the current moving window. In the present method, the remaining capacity may be calculated based on the current moving window without independently creating an additional data acquisition condition for acquisition of the remaining capacity and without any additional hardware device, whereby the problem that it is impossible to accurately track and find a BBU may be solved.

Correspondingly, the embodiments of the present disclosure also provide an apparatus for monitoring a BBU, a server, and a readable storage medium, which correspond to the method for monitoring a BBU and have the foregoing technical effects. Elaborations are omitted herein.

BRIEF DESCRIPTION OF THE DRAWINGS

In order to describe technical solutions in embodiments of the present disclosure or the prior art more clearly, drawings required to be used in descriptions about the embodiments or the prior art will be introduced briefly below. Apparently, the drawings in the description below are only some embodiments of the present disclosure. Those ordinarily skilled in the art may further obtain other drawings according to these drawings without creative work.

DETAILED DESCRIPTION

In order to make solutions of the present disclosure understood better by those skilled in the art, the present disclosure will be further described below in detail in combination with drawings and implementation modes. Clearly, described embodiments are not all but only part of embodiments of the present disclosure. All other embodiments obtained by those ordinarily skilled in the art based on the embodiments in the present disclosure without creative work shall fall within the scope of protection of the present disclosure.

For ease of understanding, technologies involved herein will now be explained and described.

A BBU is an abbreviation of Battery Backup Unit. The BBU is configured in a storage system to protect a data security after a power failure of the system. The BBU will continue to supply power after the power failure of the system. A process that ensuring a secure storage of various important data in the system is called backup.

A storage controller includes a Central Processing Unit (CPU), an internal memory, a Serial Attached Small Computer System Interface (SAS), and a storage control device capable of mounting a hard disk.

A node, namely a storage controller, includes the CPU, the internal memory, the SAS, etc.

A cluster: in a storage system, to ensure a high availability of the system, two nodes configured to form an IOGROUP. The two nodes are connected with a port of a dual-port hard disk respectively. The two nodes in the IOGROUP are opposite-side nodes to each other, and one or more IOGROUPs form the cluster where nodes may communicate with each other.

With respect to a remaining power and a capacity of the BBU, the remaining power refers to the number of charges stored in the BBU, and is practically represented as an RCC value of a voltameter. A capacity value refers to the maximum number of charges that the BBU is able to hold, and is usually a chemical capacity or a design capacity, and is practically represented as an FCC value of the voltameter.

A DOD is an abbreviation of Depth of Discharge (DOD). The DOD refers to a discharge depth of a battery, and corresponds to an open-circuit voltage of the battery.

A SOC, a full name of which is State of Charge, is also referred to as the remaining power, and represents a ratio of a remaining capacity of the battery after the battery is used for a period of time or not used for long to an FCC of the battery, and is usually expressed as a percentage. A value of the SOC ranges from 0 to 1. When SOC=0, it indicates that the battery is fully discharged. When SOC=1, it indicates that the battery is fully charged.

A near-EOL refers to that the BBU is near an End of Life.

A backup threshold value is an electric energy required by the system to dump data and shut down after the power failure of the storage system. This value is determined by an overall power consumption and a backup time of the system, and is theoretically equal to the overall power consumption (power)*the backup time. When the power of the BBU is less than the backup threshold value, the BBU is unable to support the system to complete a backup.

A BBU VPD, a full name of which is Vital Product Data, records product information, such a s a product Identifier (ID) and serial number of the BBU, and is an Electrically Erasable Programmable Read-Only Memory (EEPROM) on the BBU, which is readable and writable.

A voltameter is a battery management chip arranged in the BBU to protect charge and discharge processes and measure the remaining power and the capacity of the battery, such as TI BQ20Z45, and is also referred to as a metering chip.

Figure 1:
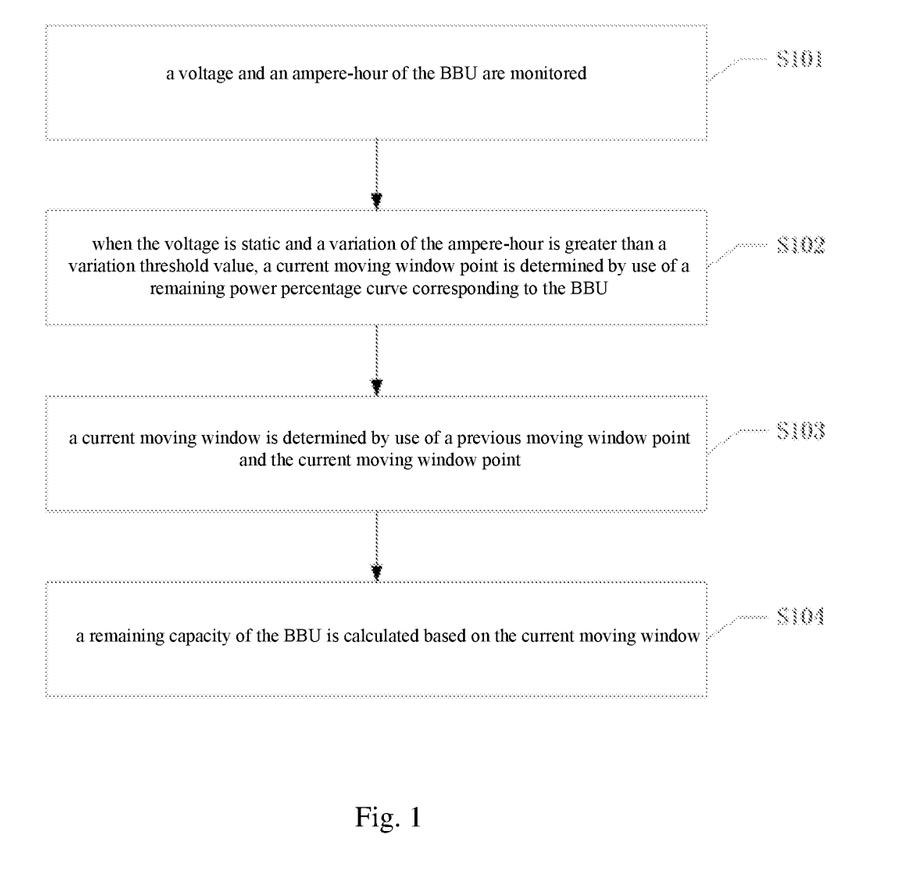
FIG. 1 is an implementation flowchart of a method for monitoring a BBU according to an embodiment of the present disclosure.

Please refer to FIG. 1, FIG. 1 is a flowchart of a method for monitoring the BBU according to an embodiment of the present disclosure. The method includes following steps.

Relational terms such as first and second are only for distinguishing an entity or operation from another entity or operation and do not necessarily require or imply an existence of any practical relation or sequence between these entities or operations.

In S101, a voltage and an ampere-hour of the BBU are monitored.

Wherein, the Ampere-hour (AH) is an index reflecting the capacity of the battery, which means time of a discharge according to a specified current. The battery with a same voltage has a large capacity with a large ampere-hour. The battery with a same ampere-hour has the large capacity with a large voltage. The capacity of the battery is usually represented by both the voltage and the ampere-hour.

That is, a power variation is statistically obtained by current-time integration. The power is accumulated during charging, and is reduced during discharging.

In S102, when the voltage is static and a variation of the ampere-hour is greater than a variation threshold value, a current moving window point is determined by use of a remaining power percentage curve corresponding to the BBU.

When the voltage is static, the voltage is the open-circuit voltage. The remaining power percentage curve is a BBU SOC curve.

It is to be noted that the moving window point herein refers to two endpoints (including a moving window starting point and a moving window ending point) of a moving window. The moving window first emerged for power systems as a demand acquisition algorithm. A moving window algorithm limits the maximum number of cells that may be received in each time window to control traffic. In the moving window algorithm, the time window does not jump forwards, and instead, moves forwards at an interval of time of a cell. A moving length is the time of a cell. For example, for average power per 15 minutes, the 15 minutes is a moving window period.

After the ampere-hour is monitored, a variation of the ampere-hour may be statistically obtained. When the variation of the ampere-hour is greater than the variation threshold value, and the voltage is static, that is, a variation rate of the voltage per unit time meets a requirement, a current moving window point may be determined by use of a remaining power percentage curve of the BBU. In some embodiments of the present disclosure, the variation threshold value corresponding to the variation of the ampere-hour may be set to 37% of a design capacity of the battery in case of dv/dt<4 uv/s.

The step that a current moving window point is determined by use of a remaining power percentage curve corresponding to the BBU may include following steps.

In a first step, whether the remaining power percentage curve exists is judged.

In a second step, if YES, the step that a current moving window point is determined by use of a remaining power percentage curve corresponding to the BBU is executed.

In a third step, if NO, the BBU is fully charged and fully discharged, the ampere-hour is recorded according to the discharge granularity so as to obtain the remaining power percentage curve, and after the remaining power percentage curve is obtained, the step that a current moving window point is determined by use of a remaining power percentage curve corresponding to the BBU is executed.

For ease of description, three steps above will be combined for description below.

The remaining power percentage curve is named after a serial number of the BBU. The first step determining whether the remaining power percentage curve exists includes following steps.

In step 1, whether there is a remaining power percentage curve corresponding to the serial number of the BBU is judged.

In step 2, if YES, it is determined that the remaining power percentage curve exists.

In step 3, if NO, it is determined that the remaining power percentage curve does not exist.

In some embodiments of the present disclosure, in order to avoid a mismatch between the BBU SOC curve and the BBU, the BBU SOC curve may further be checked. That is, the step that a current moving window point is determined by use of a remaining power percentage curve corresponding to the BBU includes that: when the remaining power percentage curve exists, the remaining power percentage curve is checked, and after successful checking, the step that a current moving window point is determined by use of a remaining power percentage curve corresponding to the BBU is executed. In some embodiments, when the remaining power percentage curve is checked, Cyclic Redundancy Check (CRC) may be performed on a file beginning, a file end, or a file content corresponding to the remaining power percentage curve.

Wherein, CRC, called cyclic code for short, is a common check code capable of detecting and correcting errors.

In some embodiments of the present disclosure, considering that the BBU is more likely to be aged and thus unable to meet a backup requirement of the storage system as service time of the BBU increases, in order to timely detect this condition to timely update the BBU, the variation threshold value may be reduced according to service time of the BBU. For example, the variation threshold value is 37% of the design capacity of the battery in a first month of use, and is reduced by 1% of the design capacity of the battery every month. That is, the variation threshold value is 27% of the design capacity of the battery after 10 months of use. In this way, as the service time of the BBU increases, it is easier to obtain the current moving window point. Therefore, a backup capability of the BBU may be effectively detected more frequently.

Figure 2:
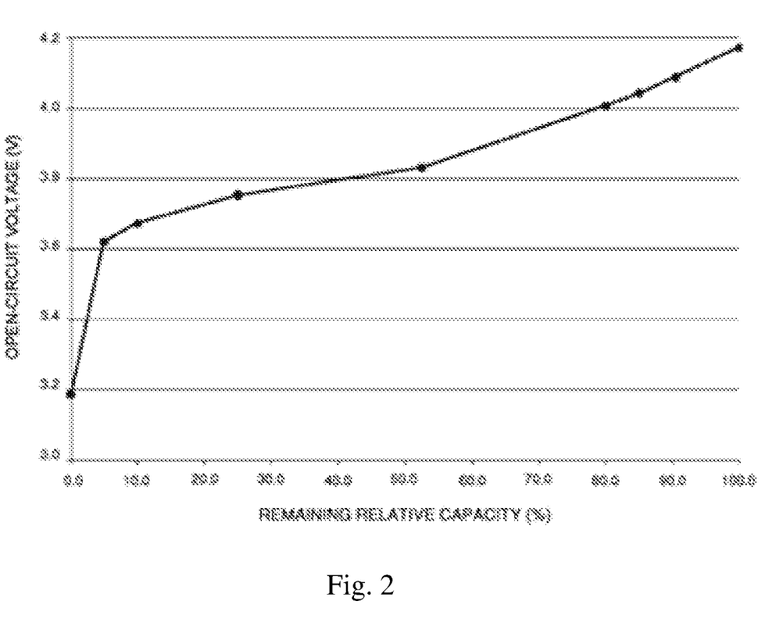
FIG. 2 is a schematic diagram of an SOC curve corresponding to a 4.2V single battery according to an embodiment of the present disclosure.

For example, when the BBU SOC curve needs to be learned, in order to avoid an influence of a learning process on the storage system, a node where the BBU is locate may be switched to a maintenance mode. That is, the node does not join any cluster and participate in any storage Input/Output (TO) service. The BBU is fully charged, and a full charge is determined in case that the battery reaches a rated voltage and the current decreases to a floating charge current, optionally preferably 80 mA. In some embodiments, the BBU is fully discharged to a cut-off voltage, and a discharge capacity is accumulated by ampere-hour statistics to obtain an FCC value. The BBU is fully charged, and the full charge is determined in case that the battery reaches the rated voltage and the current decreases to the floating charge current, optionally preferably 80 mA. Then, the BBU is discharged according to a certain discharge granularity. For example, when the discharge granularity is 1% of an FCC, discharge is stopped every time when the discharge capacity of the discharge granularity is accumulated by ampere-hour statistics until the voltage of the battery is static. A standard of a static voltage may preferably be dv/dt<4 uV/s. Data may be determined according to parameters in a system. This process is repeated again and again until a complete discharge curve is obtained, namely from 0% to 100%, every 1% corresponds to a point. The learned BBU SOC curve is as shown in FIG. 2. FIG. 2 is a schematic diagram of an SOC curve corresponding to a 4.2 V single battery according to some embodiments of the present disclosure. In the figure, the x axis is the SOC, and the y axis is the open-circuit voltage, taking V as the unit.

In S103, a current moving window is determined by use of a previous moving window point and the current moving window point.

After the current moving window point is determined, a current moving window may be determined in combination with a previous moving window point. That is, a starting point of the current moving window is the previous moving window point, and an ending point of the current moving window is the current moving window point. Each determined current moving window point may be recorded, thereby determining the previous moving window point from recorded information.

In S104, a remaining capacity of the BBU is calculated based on the current moving window.

In the present embodiment, time corresponding to the current moving window is referred to as moving window time, the power variation in the moving window time is defined as moving window power, and an SOC corresponding to the starting point of the current moving window and an SOC corresponding to the ending point of the current moving window may be determined from the BBU SOC curve. It can be seen that a remaining capacity, i.e., the FCC, of the BBU may be calculated by use of the current moving window.

A calculation process of the FCC may include following steps.

In a first step, a moving window power and a percentage difference of a moving window remaining power corresponding to the current moving window are acquired.

In a second step, a ratio of the moving window power to the percentage difference of the moving window remaining power is calculated, and the ratio is determined as the remaining capacity.

The "current moving window point" is determined and defined for the current moving window, and a previous moving window is updated as the "previous moving window point". Time between the two moving window points is "moving window time". The power variation in the "moving window time" is defined as "moving window power". $SOC_{moving\ window\ starting\ point}$ and $SOC_{moving\ window\ ending\ point}$ are obtained according to the BBU SOC curve, and the percentage difference of the moving window remaining power is "$SOC_{moving\ window\ starting\ point} - SOC_{moving\ window\ ending\ point}$". The FCC is calculated according to the moving window power. A calculation formula is as follows: FCC="moving window power"/$(SOC_{moving\ window\ starting\ point} - SOC_{moving\ window\ ending\ point})$.

After the remaining capacity is obtained, an alarm may further be given based on the remaining capacity, thereby timely replacing the BBU to ensure a power demand after the power failure of the system. That is, after step S104 is executed, alarm prompting information is output when the remaining capacity is less than an alarm threshold value.

Wherein, the alarm threshold value may be set based on a backup requirement of the storage system that the current BBU is applied to, and may generally be set to 110% of the backup threshold value.

The FCC value is compared with the alarm threshold value to judge whether the BBU is near-EOL. If YES, alarm prompting information is output. near-EOL refers to that the BBU is near the End of Life.

With an application of the method provided in embodiments of the present disclosure, the voltage and the ampere-hour of the BBU are monitored. When the voltage is static and the variation of the ampere-hour is greater than the variation threshold value, the current moving window point is determined by use of the remaining power percentage curve corresponding to the BBU. The current moving window is determined by use of a previous moving window point and the current moving window point. And the remaining capacity of the BBU is calculated by use of the current moving window.

In the present method, the voltage and the ampere-hour of the BBU are monitored, and only when the voltage is static and the variation of the ampere-hour is greater than the variation threshold value, the current moving window point is determined by use of the remaining power percentage curve corresponding to the BBU. Then, the current moving window is determined based on the previous moving window point and the current moving window point. Then, the remaining capacity of the BBU is calculated by use of the current moving window, and the alarm prompting information is output when the remaining capacity is less than the alarm threshold value. In the present method, the remaining capacity may be calculated based on the current moving window without independently creating an additional data acquisition condition for acquisition of the remaining capacity and without any additional hardware device, whereby the problem that it is impossible to accurately track and find a BBU may be solved.

In order to enable those skilled in the art to better understand the method for monitoring the BBU in some embodiments of the present disclosure, the method for monitoring the BBU will be described below in detail in combination with an application example. An application process includes following steps.

In a first step, a node that the BBU belongs to is started, and ampere-hour statistics and voltage monitoring are initiated.

A current AccumulativeCharge may be defined, for ease of looping, by use of a large enough unsigned integer data type, and is assigned to 0. Then, this value is updated by current-time integration. For example, when an average current per second during charging is 1 A, AccumulativeCharge+=1*1 mAs (milliampere second), and when an average current per second during discharging is 1 A, AccumulativeCharge-=1*1 mAs (here, to maintain the accuracy, the small unit mAs is used for statistics, and may be converted to mAh by dividing 3,600 during subsequent calculation).

In a second step, VPD information of the BBU is read, whether a BBU SOC curve file exists is judged according to a serial number of the BBU, and whether the file is correct is checked by performing CRC on a file beginning, end or content. If the file (BBU SOC curve) exists, an eighth step is executed. If the file does not exist, a third step is executed.

In the third step, if the battery is measured to obtain a curve at this point, full discharge may occur during measurement, resulting a failure to implement normal backup and a user data loss. Therefore, to avoid a data loss, the node is switched to a maintenance mode. That is, the node does not join any cluster and participate in any storage 10 service. The BBU is fully charged, and the full charge is determined in case that the battery reaches the rated voltage and the current decreases to the floating charge current, preferably 80 mA.

In a fourth step, the BBU is fully discharged to a cut-off voltage, and the discharge capacity is accumulated by an ampere-hour statistics module to obtain the FCC value.

In a fifth step, the BBU is fully charged, and the full charge is determined in case that the battery reaches the rated voltage and the current decreases to a floating charge current, optionally preferably 80 mA.

In a sixth step, the BBU is discharged according to a certain discharge granularity. For example, when the discharge granularity is 1% of the FCC, discharge is stopped every time when a discharge capacity of a discharge granularity is accumulated by ampere-hour statistics until the voltage of the battery is static. A standard of a static voltage may preferably be dv/dt<4 uV/s. Data may be determined according to parameters in a system. This process that discharge is stopped every time when the discharge capacity of a discharge granularity is accumulated by ampere-hour statistics until the voltage of the battery is static is repeated again and again until a complete discharge curve is obtained, namely from 0% to 100%, every 1% corresponds to a point.

In a seventh step, the curve is stored by the name of the serial number of the BBU according to a specified format.

In an eighth step, the node is switched to a normal mode to join a cluster and start a storage IO service.

Variables $SOC_{moving\ window\ starting\ point}$ and $SOC_{moving\ window\ ending\ point}$ may be defined to store SOC values at two points of a moving window period. Variables $AccumulativeCharge_{moving\ window\ ending\ point}$ and $AccumulativeCharge_{moving\ window\ starting\ point}$ may be defined to store ampere-hour values at the two points of the moving window period.

In a ninth step, whether the current voltage is static is judged. A judgment standard may be determined according to an electrical parameter of the BBU, and is preferably dv/dt<4 uV/s.

If the voltage is static, whether a difference between AccumulativeCharge and the $AccumulativeCharge_{moving\ window\ ending\ point}$ is greater than an ampere-hour moving window threshold value that is preferably 37% of a design capacity of the BBU. If YES, the $SOC_{moving\ window\ ending\ point}$ is updated to the $SOC_{moving\ window\ starting\ point}$, and the $AccumulativeCharge_{moving\ window\ ending\ point}$ is updated to $AccumulativeCharge_{moving\ window\ starting\ point}$. The current voltage is read, and according to the SOC curve, the SOC value is updated to the $SOC_{moving\ window\ ending\ point}$, and AccumulativeCharge is updated to $AccumulativeCharge_{moving\ window\ ending\ point}$.

In a tenth step, the FCC value is calculated according to $FCC=(AccumulativeCharge_{moving\ window\ ending\ point} - AccumulativeCharge_{moving\ window\ starting\ point})/(SOC_{moving\ window\ ending\ point} - SOC_{moving\ window\ starting\ point})$. An absolute value is calculated in the calculation process.

In an eleventh step, the FCC is compared with the backup threshold value to judge whether BBU EOL occurs. If YES, an alarm is generated to remind a user of replacing the BBU. Otherwise, the ninth step is executed.

It can be seen that, according to the method for monitoring the BBU in some embodiments of the present disclosure, an alarm may be timely given when the BBU is unable to meet a requirement of the storage system, whereby the data security of a storage device may be improved greatly. In some embodiments, the BBU EOL may be discovered timely to avoid the user data loss caused by a failure of implementing system backup normally due to the BBU aging when the system is powered on. Without additional hardware design, a BBU life cycle management is reinforced, and a system cost is reduced. The BBUs are learned to establish a set of SOC curves based on itself for each BBU, thereby implementing the accurate estimation of capacities of the BBUs as well as aging tracking. According to a moving window period point determination method, the accuracy of the open-circuit voltage is ensured, and the accuracy of the SOC is further ensured. With the use of the moving window period point determination method, the distribution discreteness of point determination is improved, and the accuracy of the FCC is improved. The FCC is obtained by calculation, whereby the dependent on an update condition of a metering chip may be avoided, and the timeliness and universality of judging BBU EOL are improved.

Corresponding to an above method embodiment, the embodiment of the present disclosure also provides an apparatus for monitoring a BBU. The apparatus for monitoring the BBU described below may mutually make corresponding references to the method for monitoring the BBU described above.

Figure 3:
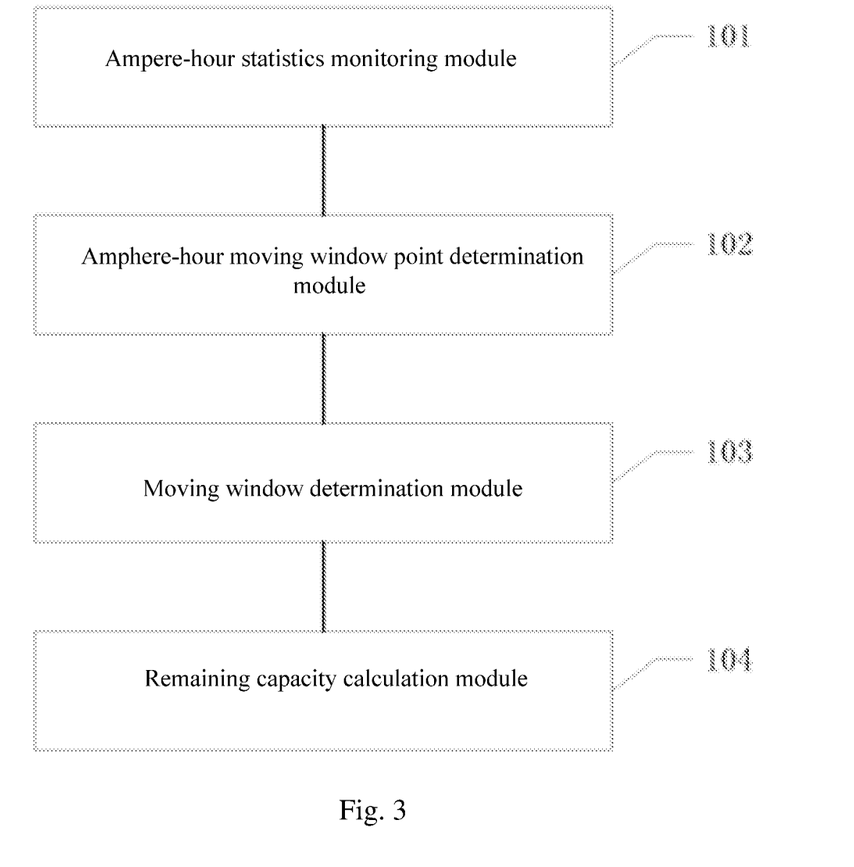
FIG. 3 is a schematic structural diagram of an apparatus for monitoring a BBU according to an embodiment of the present disclosure.

As shown in FIG. 3, the apparatus includes the following modules:
- an ampere-hour statistical monitoring module 101, configured to monitor a voltage and ampere-hour of a BBU;
- an ampere-hour moving window point determination module 102, configured to, when the voltage is static and a variation of the ampere-hour is greater than a variation threshold value, determine a current moving window point by use of a remaining capacity percentage curve corresponding to the BBU;
- a moving window determination module 103, configured to determine a current moving window by use of a previous moving window point and the current moving window point; and
- a remaining capacity calculation module 104, configured to calculate a remaining capacity of the BBU by use of the current moving window.

With the application of the apparatus provided in embodiments of the present disclosure, a voltage and ampere-hour of a BBU are monitored; when the voltage is static and the variation of the ampere-hour is greater than a variation threshold value, a current moving window point is determined by use of a remaining charge percentage curve corresponding to the BBU; a current moving window is determined by use of a previous moving window point and the current moving window point; and a remaining capacity of the BBU is calculated by use of the current moving window.

In the present apparatus, the voltage and ampere-hour of the BBU are monitored, and only when the voltage is static and the variation of the ampere-hour is greater than the variation threshold value, the current moving window point is determined by use of the remaining power percentage curve corresponding to the BBU. Then, the current moving window is determined based on the previous moving window point and the current moving window point. Then, the remaining capacity of the BBU is calculated by use of the current moving window, and the alarm prompting information is output when the remaining capacity is less than the alarm threshold value. In the present apparatus, the remaining capacity may be calculated based on the current moving window without independently creating an additional data acquisition condition for acquisition of the remaining capacity and without any additional hardware device, whereby the problem that it is impossible to accurately track and find a BBU may be solved.

In some implementation modes of the present disclosure, the remaining capacity calculation module 104 is configured to acquire moving window power and the percentage difference of the moving window remaining power corresponding to the current moving window; and calculate a ratio of the moving window power to the percentage difference of the moving window remaining power, and determine the ratio as the remaining capacity.

In some implementation modes of the present disclosure, the ampere-hour moving window point determination module 102 is configured to judge whether the remaining power percentage curve exists;
- if YES, execute the step of determining a current moving window point by use of a remaining power percentage curve corresponding to the BBU; and
- if NO, fully charge and fully discharge the BBU, record an ampere-hour according to the discharge granularity so as to obtain the remaining power percentage curve, and after the remaining power percentage curve is obtained, execute the step of determining a current moving window point by use of a remaining power percentage curve corresponding to the BBU.

In some implementation modes of the present disclosure, the remaining power percentage curve is named after a serial number of the BBU. The ampere-hour moving window point determination module 102 is configured to judge whether there is a remaining power percentage curve corresponding to the serial number of the BBU; if YES, determine that the remaining power percentage curve exists; and if NO, determine that the remaining power percentage curve does not exist.

In some implementation modes of the present disclosure, the ampere-hour moving window point determination module 102 is configured to, when the remaining power percentage curve exists, check the remaining power percentage curve, and after successful checking, execute the step of determining a current moving window point by use of a remaining power percentage curve corresponding to the BBU.

In some implementation modes of the present disclosure, the ampere-hour moving window point determination module 102 is configured to perform CRC on a file beginning, file end, or file content corresponding to the remaining power percentage curve.

In some implementation modes of the present disclosure, the apparatus further includes:
- a variation threshold value adaptive regulation module, configured to reduce the variation threshold value according to service time of the BBU.

In some implementation modes of the present disclosure, the apparatus further includes:
- an alarming module 105, configured to, after the remaining capacity of the BBU is calculated by use of the current moving window, output alarm prompting information when the remaining capacity is less than an alarm threshold value.

Corresponding to the above method embodiment, the embodiment of the present disclosure also provides a server. The server described below may mutually make corresponding references to the method for monitoring a BBU described above.

Figure 4:
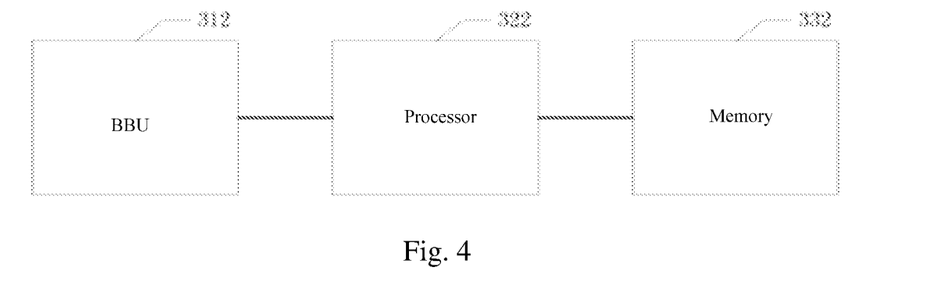
FIG. 4 is a schematic structural diagram of a server according to an embodiment of the present disclosure.

As shown in FIG. 4, the server includes:
- a BBU 312, configured to continue supplying power after a power failure;
- a memory 332, configured to store a computer program; and a processor 322, configured to execute the computer program to implement the steps of the method for monitoring a BBU in the above-mentioned method embodiment.

Figure 5:
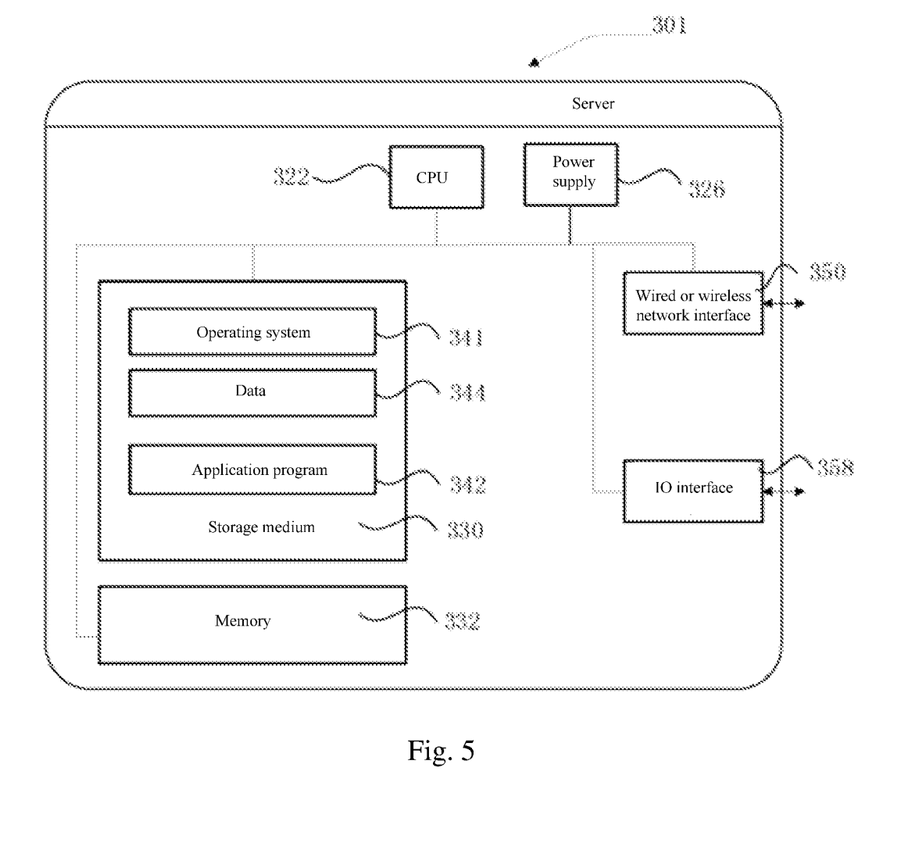
FIG. 5 is a schematic structural diagram of the server according to an embodiment of the present disclosure.

In some embodiments, referring to FIG. 5, a schematic structural diagram of a server according to an embodiment of the present disclosure is shown. The server may differ greatly in case of different configurations or performance. It may include one or more BBUs (not shown in the figure), one or more CPUs (322) (such as one or more processors) and memories 332, and one or more storage media 330 (such as one or more mass storage devices) that store application programs 342 or data 344. The memory 332 and the storage medium 330 may implement temporary storage or persistent storage. The program stored in the storage medium 330 may include one or more modules (not shown in the figure), each of which may include a series of instruction operations on a data processing device. Furthermore, the CPU 322 may be configured to communicate with the storage medium 330 to execute, on the server 301, a series of instruction operations in the storage medium 330.

The server 301 may further include one or more power supplies 326, one or more wired or wireless network interfaces 350, one or more IO interfaces 358, and/or, one or more operating systems 341, such as Windows Server™, Mac OS X™, Unix™, Linux™, and FreeBSD™.

The steps in the method for monitoring a BBU described above may be implemented by the structure of the server.

Corresponding to the above method embodiment, the embodiment of the present disclosure also provides a readable storage medium. The readable storage medium described below may mutually make corresponding references to the method for monitoring a BBU described above.

A readable storage medium is provided, storing a computer program that is executed by a processor to implement the steps of the method for monitoring a BBU in the above-mentioned method embodiment.

The readable storage medium may be various readable storage media capable of storing program codes, such as a U disk, a mobile hard disk, a Read-Only Memory (ROM), a Random Access Memory (RAM), a magnetic disk, or an optical disk.

Professionals may further realize that the units and algorithm steps of each example described in combination with the embodiments disclosed herein may be implemented by electronic hardware, computer software, or a combination thereof. In order to describe the interchangeability of hardware and software clearly, the compositions and steps of each example have been described generally in the foregoing descriptions according to functions. Whether these functions are executed by hardware or software depends on applications and design constraints of the technical solutions. Professionals may realize the described functions for each application by use of different methods, but such realization shall fall within the scope of the present disclosure.

The invention claimed is:

1. A method for monitoring a Battery Backup Unit (BBU), comprising:
   monitoring a voltage and an ampere-hour value of a BBU;
   in response to a determination that the voltage is static and a variation of the ampere-hour value is greater than a variation threshold value, determining a current moving window point by use of a remaining power percentage curve corresponding to the BBU;
   determining a current moving window by use of a previous moving window point and the current moving window point; and
   calculating a remaining capacity of the BBU by use of the current moving window.

2. The method for monitoring the BBU according to claim 1, wherein the calculating a remaining capacity of the BBU by use of the current moving window comprises:
   acquiring a moving window power and a percentage difference of a moving window remaining power corresponding to the current moving window; and
   calculating a ratio of the moving window power to the percentage difference of the moving window remaining power, and determining the ratio as the remaining capacity.

3. The method for monitoring a BBU according to claim 1, wherein the determining a current moving window point by use of a remaining power percentage curve corresponding to the BBU comprises:
   judging whether the remaining power percentage curve exists;
   in response to a judgement that the remaining power percentage curve exists, determining the current moving window point by use of the remaining power percentage curve corresponding to the BBU; and
   in response to a judgement that the remaining power percentage curve does not exist, fully charging and fully discharging the BBU, and recording an ampere-hour value according to a discharge granularity so as to obtain the remaining power percentage curve, and after the remaining power percentage curve is obtained, determining the current moving window point by use of the remaining power percentage curve corresponding to the BBU.

4. The method for monitoring a BBU according to claim 3, wherein the remaining power percentage curve is named after a serial number of the BBU, and the judging whether the remaining power percentage curve exists comprises:
   judging whether there is the remaining power percentage curve corresponding to the serial number of the BBU;
   in response to a judgement that there is the remaining power percentage curve corresponding to the serial number of the BBU, determining that the remaining power percentage curve exists; and
   in response to a judgement that there is no remaining power percentage curve corresponding to the serial number of the BBU, determining that the remaining power percentage curve does not exist.

5. The method for monitoring a BBU according to claim 3, wherein the determining a current moving window point by use of a remaining power percentage curve corresponding to the BBU comprises:
   in response to a determination that the remaining power percentage curve exists, checking the remaining power percentage curve, and after successful checking, determining the current moving window point by use of the remaining power percentage curve corresponding to the BBU.

6. The method for monitoring a BBU according to claim 5, wherein the checking the remaining power percentage curve comprises:
   performing a Cyclic Redundancy Check (CRC) on a file beginning, a file end, or a file content corresponding to the remaining power percentage curve.

7. The method for monitoring a BBU according to claim 1, further comprising:

reducing the variation threshold value according to a service time of the BBU.

8. The method for monitoring a BBU according to claim 1, wherein after the calculating a remaining capacity of the BBU by use of the current moving window, the method further comprises:
outputting alarm prompting information in response to a determination that the remaining capacity is less than an alarm threshold value.

9. A server, comprising:
a Battery Backup Unit (BBU), configured to continue supplying power after a power failure;
a memory, configured to store a computer program; and
a processor, configured to execute the computer program, and upon execution of the computer program, is configured to:
monitor a voltage and an ampere-hour value of a BBU;
in response to a determination that the voltage is static and a variation of the ampere-hour value is greater than a variation threshold value, determine a current moving window point by use of a remaining power percentage curve corresponding to the BBU;
determine a current moving window by use of a previous moving window point and the current moving window point; and
calculate a remaining capacity of the BBU by use of the current moving window.

10. The server according to claim 9, wherein in order to calculate the remaining capacity of the BBU by use of the current moving window, the processor, upon execution of the computer program, is configured to:
acquire a moving window power and a percentage difference of a moving window remaining power corresponding to the current moving window; and
calculate a ratio of the moving window power to the percentage difference of the moving window remaining power, and determining the ratio as the remaining capacity.

11. The server according to claim 9, wherein in order to determine the current moving window point by use of the remaining power percentage curve corresponding to the BBU, the processor, upon execution of the computer program, is configured to:
judge whether the remaining power percentage curve exists;
in response to a judgement that the remaining power percentage curve exists, determine the current moving window point by use of the remaining power percentage curve corresponding to the BBU; and
in response to a judgement that the remaining power percentage curve does not exist, fully charge and fully discharge the BBU, and record an ampere-hour value according to a discharge granularity so as to obtain the remaining power percentage curve, and after the remaining power percentage curve is obtained, determine the current moving window point by use of the remaining power percentage curve corresponding to the BBU.

12. The server according to claim 11, wherein the remaining power percentage curve is named after a serial number of the BBU, and in order to judge whether the remaining power percentage curve exists, the processor, upon execution of the computer program, is configured to:
judge whether there is the remaining power percentage curve corresponding to the serial number of the BBU;
in response to a judgement that there is the remaining power percentage curve corresponding to the serial number of the BBU, determine that the remaining power percentage curve exists; and
in response to a judgement that there is no remaining power percentage curve corresponding to the serial number of the BBU, determine that the remaining power percentage curve does not exist.

13. The server according to claim 12, wherein in order to determine the current moving window point by use of the remaining power percentage curve corresponding to the BBU, the processor, upon execution of the computer program, is configured to:
in response to a determination that the remaining power percentage curve exists, check the remaining power percentage curve, and after successful checking, determine the current moving window point by use of the remaining power percentage curve corresponding to the BBU.

14. The server according to claim 9, wherein after a calculation of the remaining capacity of the BBU by use of the current moving window, the processor, upon execution of the computer program, is further configured to:
output alarm prompting information in response to a determination that the remaining capacity is less than an alarm threshold value.

15. A non-transitory storage medium, storing a computer program that is executable by a processor, and upon execution by the processor, is configured to cause the processor to:
monitor a voltage and an ampere-hour value of a BBU;
in response to a determination that the voltage is static and a variation of the ampere-hour value is greater than a variation threshold value, determine a current moving window point by use of a remaining power percentage curve corresponding to the BBU;
determine a current moving window by use of a previous moving window point and the current moving window point; and
calculate a remaining capacity of the BBU by use of the current moving window.

16. The non-transitory storage medium according to claim 15, wherein the computer program, in order to cause the processor to calculate the remaining capacity of the BBU by use of the current moving window, is configured to cause the processor to:
acquire a moving window power and a percentage difference of a moving window remaining power corresponding to the current moving window; and
calculate a ratio of the moving window power to the percentage difference of the moving window remaining power, and determine the ratio as the remaining capacity.

17. The non-transitory storage medium according to claim 15, wherein the computer program, in order to cause the processor to determine the current moving window point by use of the remaining power percentage curve corresponding to the BBU, is configured to cause the processor to:
judge whether the remaining power percentage curve exists;
in response to a judgement that the remaining power percentage curve exists, determine the current moving window point by use of the remaining power percentage curve corresponding to the BBU; and
in response to a judgement that the remaining power percentage curve does not exist, fully charge and fully discharge the BBU, and record an ampere-hour value according to a discharge granularity so as to obtain the remaining power percentage curve, and after the remaining power percentage curve is obtained, determine the current moving window point by use of the remaining power percentage curve corresponding to the BBU.

18. The non-transitory storage medium according to claim 17, wherein the remaining power percentage curve is named after a serial number of the BBU, and the computer program, in order to cause the processor to judge whether the remaining power percentage curve exists, is configured to cause the processor to:
  judge whether there is the remaining power percentage curve corresponding to the serial number of the BBU;
  in response to a judgement that there is the remaining power percentage curve corresponding to the serial number of the BBU, determine that the remaining power percentage curve exists; and
  in response to a judgement that there is no remaining power percentage curve corresponding to the serial number of the BBU, determine that the remaining power percentage curve does not exist.

19. The non-transitory storage medium according to claim 18, wherein the computer program, in order to cause the processor to determine the current moving window point by use of the remaining power percentage curve corresponding to the BBU, is configured to cause the processor to:
  in response to a determination that the remaining power percentage curve exists, check the remaining power percentage curve, and after successful checking, determine the current moving window point by use of the remaining power percentage curve corresponding to the BBU.

20. The non-transitory storage medium according to claim 15, wherein after a calculation of the remaining capacity of the BBU by use of the current moving window, the computer program, upon execution by the processor, is configured to cause the processor to:
  output alarm prompting information in response to a determination that the remaining capacity is less than an alarm threshold value.

\* \* \* \* \*